(12) United States Patent
Day (10) Patent No.: US 7,406,641 B2
(45) Date of Patent: Jul. 29, 2008

(54) SELECTIVE CONTROL OF TEST-ACCESS PORTS IN INTEGRATED CIRCUITS

(75) Inventor: Daniel A. Day, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 666 days.

(21) Appl. No.: 10/612,293

(22) Filed: Jun. 30, 2003

(65) Prior Publication Data

US 2004/0267480 A1    Dec. 30, 2004

(51) Int. Cl.
*G01R 31/28* (2006.01)
(52) U.S. Cl. .................... 714/727; 714/726
(58) Field of Classification Search ............ 714/724, 714/725, 726, 727, 729, 733, 734, 30; 716/4
See application file for complete search history.

(56) References Cited

U.S. PATENT DOCUMENTS

| | | | | |
|---|---|---|---|---|
| 4,078,259 A * | 3/1978 | Soulsby et al. | ......... | 710/15 |
| 4,672,535 A * | 6/1987 | Katzman et al. | ......... | 710/38 |
| 5,396,501 A | 3/1995 | Sengoku | ......... | 371/22 |
| 5,434,804 A | 7/1995 | Bock et al. | ......... | 364/579 |
| 5,583,430 A | 12/1996 | Dinteman | ......... | 324/158.1 |
| 5,708,773 A | 1/1998 | Jeppesen, III et al. | .. | 395/183.06 |
| 6,052,811 A | 4/2000 | Ahsuri | ......... | 714/745 |
| 6,101,622 A | 8/2000 | Lesmeister | ......... | 714/724 |
| 6,122,762 A | 9/2000 | Kim | ......... | 714/726 |
| 6,181,151 B1 | 1/2001 | Wasson | ......... | 324/765 |
| 6,205,560 B1 | 3/2001 | Hervin | ......... | 714/34 |
| 6,266,793 B1 | 7/2001 | Mozdzen et al. | ......... | 714/727 |
| 6,380,730 B1 | 4/2002 | Arkin et al. | ......... | 324/158.1 |
| 6,392,404 B1 | 5/2002 | Kuglin | ......... | 324/158.1 |
| 6,392,866 B1 | 5/2002 | Dinteman | ......... | 361/206 |
| 6,446,230 B1 | 9/2002 | Chung | ......... | 714/726 |
| 6,449,755 B1 | 9/2002 | Beausang et al. | ......... | 716/5 |
| 6,530,047 B1 * | 3/2003 | Edwards et al. | ......... | 714/724 |
| 6,763,485 B2 * | 7/2004 | Whetsel | ......... | 714/726 |
| 6,829,730 B2 * | 12/2004 | Nadeau-Dostie et al. | ...... | 714/30 |

OTHER PUBLICATIONS

"Boundary Scan (JTAG) Tools and Circuit Board Test Solutions", www.acculogic.com/Products/BoundaryScanHome.htm, 2 pages.
"Designing for On-Board Programming Using the IEEE 1149.1 (JTAG) Access Port", *Intel AP-630 Application Note, Intel order No. 292186-002*, available from http://www.intel.com, (Nov. 1996), 14 pages.

(Continued)

*Primary Examiner*—Phung M Chung
(74) *Attorney, Agent, or Firm*—Schwegman, Lundberg & Woessner, P.A.

(57) ABSTRACT

To facilitate testing, some integrated circuits include built-in test circuits, called test-access ports (TAPs). The present inventor recognized that TAPs are sometimes used with automatic testers that have limitations, such as insufficient memory capacity, that make it difficult or costly to test some integrated circuits, such as microprocessors. Accordingly, this disclosure teaches, among other things, inputting test signals to a TAP of an integrated circuit using a first device, such as an automatic tester, and outputting state data related to the input test signals from the TAP using a second device.

23 Claims, 4 Drawing Sheets

OTHER PUBLICATIONS

"Joint Test Action Group from FOLDOC", *Available from* http://wombat.doc.ic.ac.uk/foldoc/foldoc.cgi?Joint+Test+Action+Group, (Nov. 15, 1999), 1 page.

"The New Vanguard 330 From Integrated Measurement Systems Offers Cost-Effective Validation of High Performance Logic ICs", www.engineering-uk.co.uk, (Apr. 24, 2001),2 Pages.

* cited by examiner

SELECTIVE CONTROL OF TEST-ACCESS PORTS IN INTEGRATED CIRCUITS

TECHNICAL FIELD

Various embodiments of the present invention concern testing and debugging of integrated circuits, particularly complex integrated circuits, such as microprocessors, that have test-access ports.

BACKGROUND

Integrated circuits, the key components in thousands of electronic products, are interconnected networks of electrical components. Fabricators typically build these circuits layer by layer on a semiconductive wafer, using techniques, such as doping, masking, and etching, to form and then connect thousands and even millions of microscopic transistors. The wafer is then diced to define individual circuits, commonly known as ICs or chips, which are ultimately tested to verify performance.

Some conventional test techniques use a special test circuit, called a test-access port (TAP), which is built into the integrated circuit. Most, if not all, TAPs are designed to function in compliance with a standard, referred to as IEEE (Institute of Electrical and Electronic Engineers) 1149.1-2001, entitled Standard Test Access Port and Boundary-Scan Architecture. The standard was originally developed by the Joint Test Action Group (JTAG) and TAPs that comply with it are often called JTAG ports.

TAPs are often used with automatic test equipment that feeds a test pattern of voltages into the integrated through pins of the TAP. The test equipment then reads out the actual logic states of the integrated circuit, comparing them against expected logic states. A mismatch of the actual and expected logic states indicates a circuit failure. In response to a failure, the test equipment holds the circuit in the failed condition, and reads out (or "dumps") the state values for the entire circuit to memory in the test equipment for further detailed analysis by other specialized equipment.

One problem the present inventor recognized in using TAPs with automatic test equipment is that integrated circuits, such as microprocessors, have outgrown the capacity of some automatic test equipment to read in all the state values while also storing their test patterns and maintaining the circuit in a failed condition. In other words, the test patterns and related data for testing these circuits consume most of the memory in the test equipment, leaving insufficient space for programming the TAP and storing all the state values.

To address this problem, some troubleshooters have opted to expand the memory capacity of their automatic test equipment. However, because of the high operating frequencies of the test equipment, this memory expansion can be quite expensive, with the cost to expand some types of testers approaching a million dollars per tester.

Other troubleshooters have resorted to working around the problem by rerunning the test pattern many times and building the complete set of state values, piece by piece through a series of partial dumps. However, this approach is not only quite time consuming, but also potentially ineffective when used with some complex integrated circuits, such as microprocessors. Microprocessors can behave unpredictably at times and make it difficult, if not impossible, to repeat a failure as often as necessary to collect a complete set of state values. Thus, in some instances, troubleshooters could be left to resolve a failure using an incomplete set of state values, or worse yet without sufficient data to resolve the failure at all.

Accordingly, there is a need for other ways of overcoming the memory limitations of automatic test equipment.

DETAILED DESCRIPTION OF EXEMPLARY EMBODIMENT(S)

This description, which references and incorporates the above-identified figures and the appended claims, describes one or more specific embodiments of one or more inventions. These embodiments, offered not to limit but only to exemplify and teach the one or more inventions, are shown and described in sufficient detail to enable those skilled in the art to make and use the invention. Thus, where appropriate to avoid obscuring the one or more inventions, the description may omit certain information known to those of skill in the art.

Definitions

The description includes many terms with meanings derived from their usage in the art or from their usage within the context of the description. However, as a further aid, the following exemplary definitions are presented.

As used herein, the terms "a" and "an" refer to at least one.

As used herein, the term "or" is used in its Boolean logical sense, unless used in conjunction with "either."

As used herein, the term "JTAG" refers to any prior or future version or derivative of IEEE 1149.1-2001 standard. When used as a modifier, JTAG connotes compliance inclusively or exclusively with at least one version or derivative of IEEE 1149.1-2001.

Exemplary System

Figure 1:
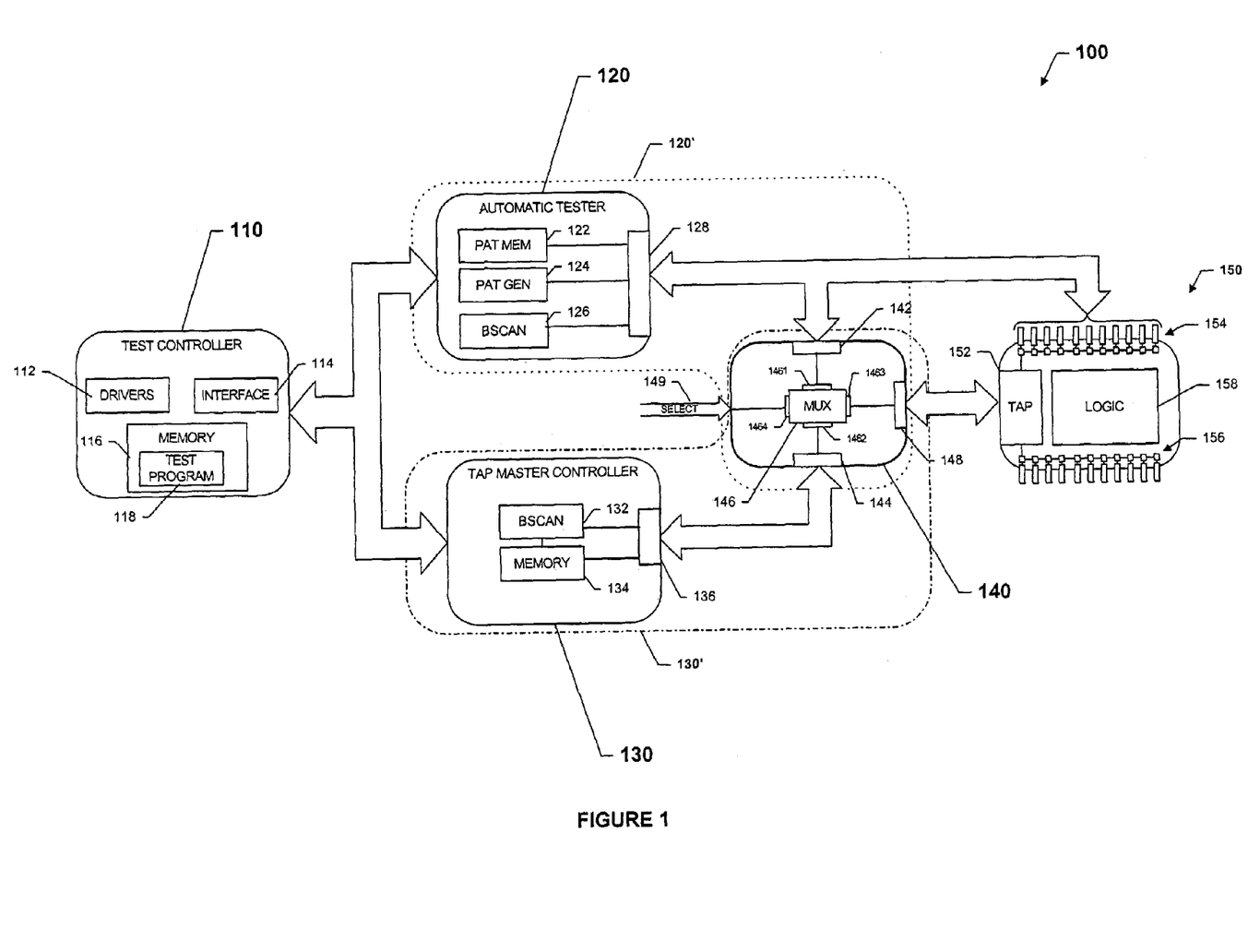
FIG. 1 is a block diagram of an exemplary integrated-circuit testing system 100 corresponding to one or more embodiments of the present invention.

FIG. 1 shows a block diagram of an exemplary integrated-circuit testing system 100. System 100 includes a test controller 110, an automatic tester 120, Test-Access-Port (TAP) master controller 130, a TAP-control selector 140, and a device under test (DUT) 150.

Test controller 110 includes device drivers 112 and programmatic interfaces 114 for commanding and interfacing with ATE engineering tester 120 and TAP master controller 120 in accord with one or more test programs 116 stored in an electronic, magnetic, and/or optical memory 118. In the exemplary embodiment, test controller 110 takes the form of a 32-bit Linux based computer system, and couples to tester 120 and controller 130 via PCI (Peripheral Computer Interface) or USB (Universal Serial Bus) interfaces.

Automatic tester 120, which in the exemplary embodiment takes the form of a commercial debug tester, such as the IMS Vanguard debug tester from Integrated Measurement Systems, Inc. of Beaverton, Oreg., includes a parallel vector pattern memory 122, an algorithmic pattern generator 124, a boundary-scan controller 126, and a test connector 128. (IMS and Vanguard may be trademarks of Integrated Measurement Systems, Inc. or its parent company Credence Systems Corporation of Fremont, Calif.) Other embodiments may use other forms of testers.

More specifically, parallel vector pattern memory 122 stores test-pattern data (not shown), which is generated by, for example, logic simulations for the device under test. Pattern generator 124 includes timing and other circuitry (not shown) for generating and outputting electrical (or other types of) signals based on the algorithms and/or data (not shown.) In the exemplary embodiment, memory 122 and pattern generator 124 provide up to 512 parallel channels of test vector data; however, other embodiments may provide other numbers of channels. Also in the exemplary embodiment, memory 122 takes the form of one or more high-speed test memory modules.

Boundary-scan controller (BSCAN) 126, which in the exemplary embodiment is JTAG compliant, includes circuitry for generating and processing JTAG signals: a Test Reset Input (TRST) signal, a Test Clock (TCK) signal, a Test Mode Select (TMS) signal, a Test Data Input (TDI) signal, and a Test Data Output (TDO) signals (all not shown in this view). The TRST signal resets the TAP state machine within the device under test; the TCK signal provides a test synchronization clock; the TMS signal, a state-machine control signal, sets the mode of the TAP; the TDI signal provides test instructions and data; and the TDO signal provides serial output of test data. (IEEE standard 1149.1 describes the TRST, TCK, TMS, TDI, and TDO signals in more detail.) In other embodiments, boundary-scan controller 126 may use other types of signals for control of design-for-test (DFT) or in-circuit test (ICT) features.

Test connector 128 is coupled to pattern memory 122, pattern generator 124, and boundary-scan controller 126. In the exemplary embodiment, test connector 128, which is intended for connection to a DUT, takes the form of a Framatome Connectors International (FCI) shrouded header 61698-302TR connector. However, other embodiments use other forms of connectors.

TAP master controller 130 includes a boundary-scan controller 132 and a memory 134. Boundary-scan controller (BSCAN) 132, which in the exemplary embodiment is JTAG compliant, includes circuitry for generating and processing JTAG signals: Test Clock (TCK) signal, Test Reset Input (TRST) signal, Test Mode Select (TMS) signal, Test Data Input (TDI) signals, and Test Data Output (TDO) signals (all not shown in this view). Memory 134, in the exemplary embodiment, stores message-scan data from a DUT and takes the form of a slower and/or lower-cost memory than memory 132. In other embodiments, memory 134 may also store input test data for the DUT and other information for programming a TAP state machine (not shown).

TAP-control selector 140 includes a tester connector 142, a controller connector 144, a multiplexer 146, a TAP connector 148, and a controller-selection input 149. (Broken-line boxes 120' and 130' highlight that in some embodiments, TAP-control selector 140 is integrated into tester 120 or controller 130, by for example, being included as an auxiliary or accessory card. Some embodiments integrate the selector in the tester interface hardware to ensure high signal integrity.) Tester connector 142 and controller connector 144 respectively couple JTAG signals from tester 120 and controller 130 to multiplexer 146.

Multiplexer 146, which selectively couples the JTAG signals from tester or the TAP controller (or portions thereof) to device-under-test (DUT) 150, includes inputs 1461, inputs 1462, control (or selection) input 1463, and outputs 1464. Inputs 1461 are coupled to controller connector 142, and inputs 1462 are coupled to tester connector 144. Control input 1463 is coupled to controller-selection input 149, which in the exemplary embodiment is coupled to tester 120 via tester connector 142. Control input 1463 selectively operates multiplexer 146 to couple inputs 1461 or inputs 1462 (in other words, controller connector 142 or tester connector 144) to outputs 1464. Outputs 1464 are coupled to TAP connector 148, which is also JTAG compliant in the exemplary embodiment. TAP connector 148 is coupled to a TAP 152 in DUT 150.

In addition to TAP 152, which in the exemplary embodiment is also JTAG compliant, DUT 150 includes external pins 154, boundary-scan cells 156, and core logic circuitry 158. TAP 152 includes an instruction register and a bypass register, which are not shown. Boundary-scan cells 156 collectively constitute a boundary-scan register. During normal operation of the DUT, these cells allow input and output signals to pass freely from the external pins through each boundary-scan cell to the core logic. However, during testing, these cells block this passage, not only allowing shifting test data into the cells and thus into the core logic via the TDI signal, but also capturing and shifting response data from the core logic out of the DUT via the TDO signal for storage and inspection. Other embodiments may use other types of design-for-test (DFT) features, such as scan chains coupled to execution registers, selected flip-flops, or other storage elements.

Exemplary Methods of Operation

Figure 2:
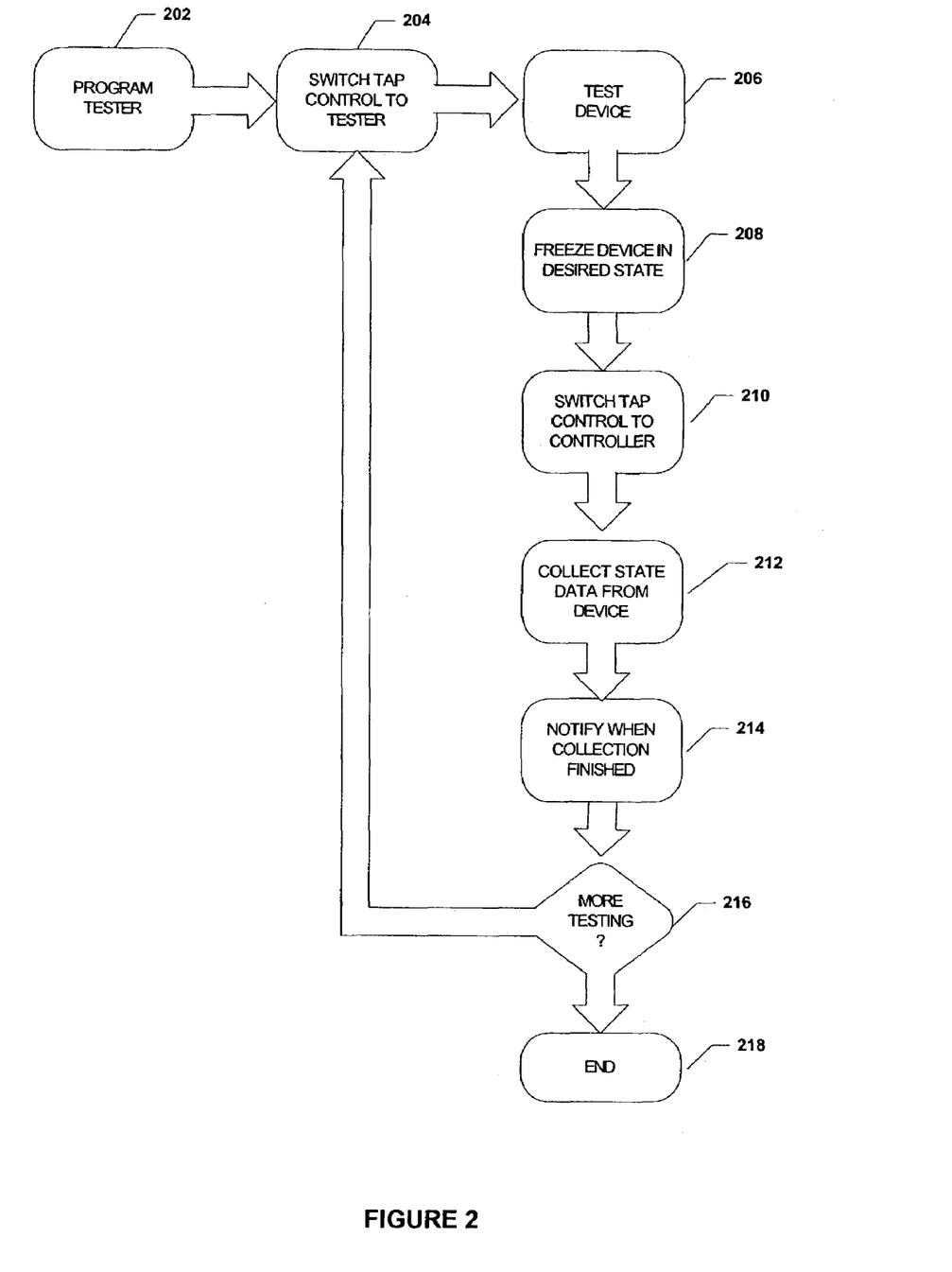
FIG. 2 is a flow chart of an exemplary method of operating a testing system, in accord with one or more embodiments of the present invention.

FIG. 2 shows a flow chart 200 of an exemplary method of operating system 100. Flow chart includes process blocks 202-218. Though these blocks (as well as the blocks in any other flow charts in this document) are arranged and described serially in the exemplary embodiment, other embodiments may reorder the blocks, omit one or more blocks, combine two or more blocks, and/or execute two or more blocks in parallel using multiple processors or a single processor organized as two or more virtual machines or sub-processors. Moreover, still other embodiments implement the blocks as one or more specific interconnected hardware or integrated-circuit modules with related control and data signals communicated between and through the modules. Thus, this and other exemplary process flows in this document are applicable to software, firmware, hardware, and other types of implementations.

At block 202, the exemplary method begins by programming tester 120 and TAP controller 130. In the exemplary embodiment, test controller 110 loads one or more portions of test program 116 onto tester 120, with the loaded portions including instructions commanding the tester to test an integrated circuit using its TAP, to freeze the internal state of the circuit after establishing a targeted test condition, such as a failed condition, and to switch control of the TAP to controller 130 after freezing the circuit in the targeted test condition. Programming the tester also entails loading functional-test-pattern data from tester controller 110 into memory 124 of tester 120 or into pattern generator 122. Test controller 110 also loads one or more portions of test program 116 onto TAP controller 130, with these portions including, for example, instruction-register and data-register instructions for performing a message-scan or state-dump procedure on DUT 150 via TAP 152. Execution continues at block 204.

Block 204 switches control of the TAP to tester 120. In the exemplary embodiment, this entails tester 120 asserting a control signal through test connector 128 to controller-selection input 149 and ultimately to control input 1463 of multiplexer module 146 in TAP-control selector 140. (Some embodiments may use test controller 110 or another device to switch control of the TAP.) As a result, multiplexer module 146 couples multiplexer outputs 1464 and TAP connector 148 to tester connector 122, giving tester 120 control of the TCK, TMS, TDI, and TDO contacts of TAP 152. In the exemplary embodiment, the TRST contact of TAP 152 is always driven directly by tester 120 to eliminate risk of accidental TAP reset during switching of multiplexer 146. Exemplary execution then proceeds to block 206.

Block 206 entails beginning the preprogrammed vector functional test of DUT 150 to induce the targeted test condition. Tester 130 begins the functional test by outputting signals based on the test-pattern data to DUT 150 and processing the response of DUT 150.

In block 208, tester 130 freezes the DUT in a desired logic state or condition, such as failed condition. In the exemplary embodiment, the freezing occurs in response to the tester detecting a failure in DUT 150, for example, a failed bus transaction or a signal mismatch. The freezing itself entails forcing tester 120 into a control loop to maintain power, clocks, and termination voltages for DUT 150.

Next, block 210 switches control of the TAP from tester 120 to TAP controller 130. In the exemplary embodiment, this entails tester 120 deasserting the control signal applied through test connector 128 to control input 1463 of multiplexer 140, thereby coupling controller connector 132 to TAP 152 via multiplexer outputs 1464 and TAP connector 148. In addition, tester 120 notifies TAP controller 130 of the switch over using a separate hardware trigger signal to the TAP controller or a software API call of the TAP controller, effectively triggering execution of block 212.

In block 212, TAP controller 130 collects state values from DUT 150. In the exemplary embodiment, this collection entails controller 120 performing a JTAG message-scan procedure to dump state values from DUT 150, using the TDO signal of TAP 152, into memory 134 of TAP controller 130 for a predetermined portion of the DUT, for example the entire DUT. Exemplary state values include scanout chains, arrays, control registers, caches, etc. TAP controller 130 then transfers the state values to test controller 110 and notifies tester 120 by for example, toggling a control signal monitored by tester 120, when the dump is complete, that is when the last state values are transferred from the DUT to TAP controller 130.

In block 214, tester 120 responds to the dump-complete notification from TAP controller 130 by exiting the control loop established to freeze the DUT in the desired condition. Execution continues to block 216.

Block 216 determines whether there is further testing to be done. In the exemplary embodiment, tester 120 makes this determination based on the programming completed at block 202, specifically whether there are additional instructions to execute. If further testing is dictated, execution of the exemplary method returns to block 204 to switch control of TAP 152 to tester 120; otherwise, execution terminates at block 218. Some embodiments branch directly from block 214 back to block 202 for further programming input.

Exemplary TAP-Control Selector

Figure 3:
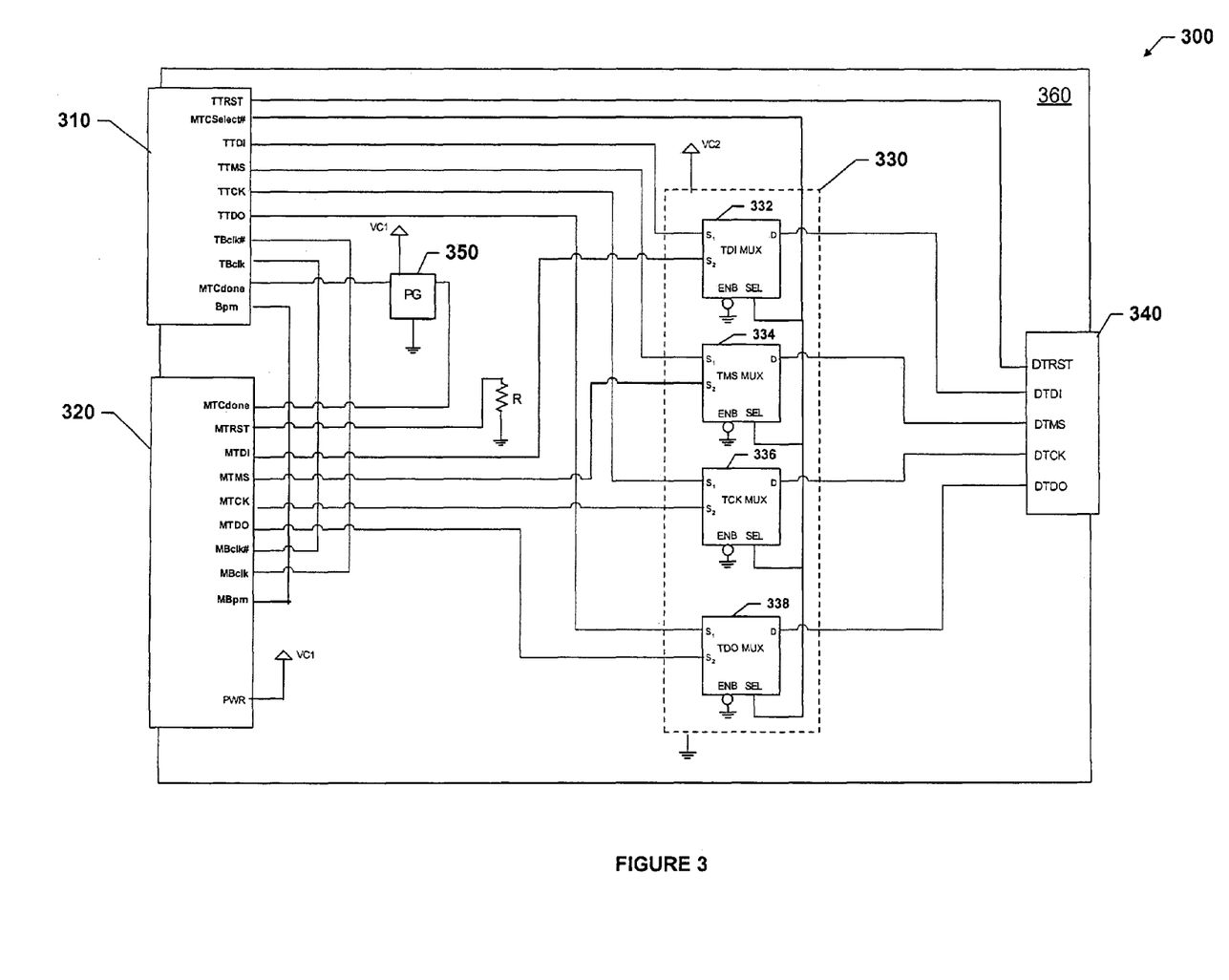
FIG. 3 is a schematic diagram of an exemplary port-control selector 300 that corresponds to one or more embodiments of the present invention.

FIG. 3 is a schematic diagram of an exemplary TAP-control selector 300, which represents one potential implementation of TAP-control selector 140 in system 100. TAP-control selector 300 includes supply nodes VC1, VC2, and VSS; a tester connector 310; a master-tap-controller (MTC) connector 320; a multiplexer module 330; a TAP connector 340; a pulse generator 350; and a common circuit board 360 supporting these components. Supply nodes VC1 and VC2, in the exemplary embodiment, are coupled to respective 3.3 VDC and 1.4 VDC power supplies (not shown), and VSS is coupled to ground. The exemplary embodiment derives the VC1 supply from an auxiliary supply of tester 120, such as a timing card (not shown), and the VC2 supply from a power supply in the tester auxiliary rack (also not shown.) Generally, the VC2 supply should not be used to power the DUT. Some embodiments may use other power-supply arrangements for supply nodes VC1 and VC2. However, these arrangements are preferably separate from power supplies for the DUT.

Tester connector 310, which takes the exemplary form of a 9-pin FCI connector, includes a TTRST signal pin, master-tap-controller (MTC)-select signal pin, a TTDI signal pin, a TTMS signal pin, a TTCK signal pin, a TTDO signal pin, differential clock CLKp, CLKn pins, an interrupt (ITRPT) signal pin, and a bpm4# signal pin.

MTC connector 320, which takes the exemplary form of a 26-pin FCI connector, includes 25 pins, although only those relevant to use of the test-access port of the exemplary embodiment are shown. Those that are not shown are coupled directly or via suitable resistor to ground or supply node VC2 as appropriate for the particular form of master-tap controller. More particularly, MTC connector 320 includes an MTC-done signal pin, an MTRST signal pin, an MTDI signal pin, an MTMS signal pin, an MTCK signal pin, an MTDO signal pin, differential clock pins MCLKp, CLKn, and a Mbpm signal pin. The MTRST signal pin is coupled to ground via a resistor R1. Differential clock pins MCLKp and MCLKn are coupled respectively to the CLKp and CLKn pins of tester connector 310; and the Mbpm signal pin is coupled to the Bpm signal pin of tester connector 310. In the exemplary embodiment, the tester uses the Bpm and Mbpm pins to communicate a trigger signal to the TAP controller to control initiation of the message-scan procedure.

Multiplexer module 330 includes four 2:1 multiplexers 332, 334, 336, and 338. In the exemplary embodiment, module 330 takes the form of a quad 2:1 mux/demux bus switch, such as a model IDTQS3VH257 bus switch from Integrated Device Technology, Inc. of Santa Clara, Calif. Each of the multiplexers includes selectable signal inputs (or nodes) S1 and S2, a select input SEL, an enable input ENB, and a non-selectable output node D, with nodes S1 and S2 being selectively coupled to output node D based on the logic states of input ENB and select input SEL.

The S1 signal pins for multiplexers 332, 334, 336, and 338 are connected respectively to the TTDI, TTMS, TTCK, and TTDO pins of tester connector 310. The S2 signal inputs for multiplexers 332, 334, 336, and 338 are connected respectively to the MTDI, MTMS, MTCK and MTDO pins of master-tap-controller (MTC) connector 320. In the exemplary embodiment, the MTDI, MTMS, and MTDO connections to the multiplexer module are terminated with respective 150-, 39-, and −75-Ohm pull-up resistors (not shown), and the MTCK connection is terminated with a 27-Ohm pull-down resistor (also not shown.)

The D outputs for multiplexers 332, 334, 336, and 338 are connected respectively to the DTDI, DTMS, DTCK, and DTDO pins of TAP connector 340. Although not shown in this figure, the exemplary embodiment terminates the DTDI, DTMS, and DTDO connections to tap connector 340 with 1-kilo-ohm pull-up resistors (not shown) to VC2, and the DTCK connection with a 1-kilo-ohm pull-down resistor (also not shown) to ground. The exemplary embodiment also couples an FBO signal from master-tap-controller to the DTCK input pin of connector 340. The FBO signal is a feedback of the MTCK signal back to the master TAP controller that is used to register data coming in from DTDO.

TAP connector 340, which is mounted as close as practical to multiplexer module 330, further includes a DTRST signal pin, which is coupled to the TTRST pin of tester connector 310. In exemplary embodiment, TAP connector 340 takes the form of an IMS Vanguard pogo-pin interface board.

Pulse generator 350 is coupled between the MTCdone pin of MTC connector 320 and the INTRPT signal pin of tester connector 310. Pulse generator 350 generates a well-defined pulse upon receiving a signal from master-tap controller 130 (in FIG. 1) that the master-tap controller has completed a dump of state information from DUT 150 and is therefore ready for tester 120 to assume control of TAP 152 for DUT 150.

Instead of a multiplexer module, some embodiments use other types of switching elements, such as a set of single-pole, double-throw switches or relays. One example of a suitable relay is the Teledyne RF100 High Repeatability Ultraminiature Centigrid Relay, available from Teledyne Relays of Hawthorne, Calif. Still other embodiments may use other forms of selective connection or switching arrangements. And still other embodiments may omit the set of multiplexers used in the exemplary embodiment by directly connecting the JTAG pins of both tester 120 and tap controller 130 to the TAP of the DUT and selectively enabling and/or disabling one or more of the JTAG pins for the tester or tap controller to determine which device controls and/or accesses one or more pins of the TAP.

Exemplary Pulse Generator

Figure 4:
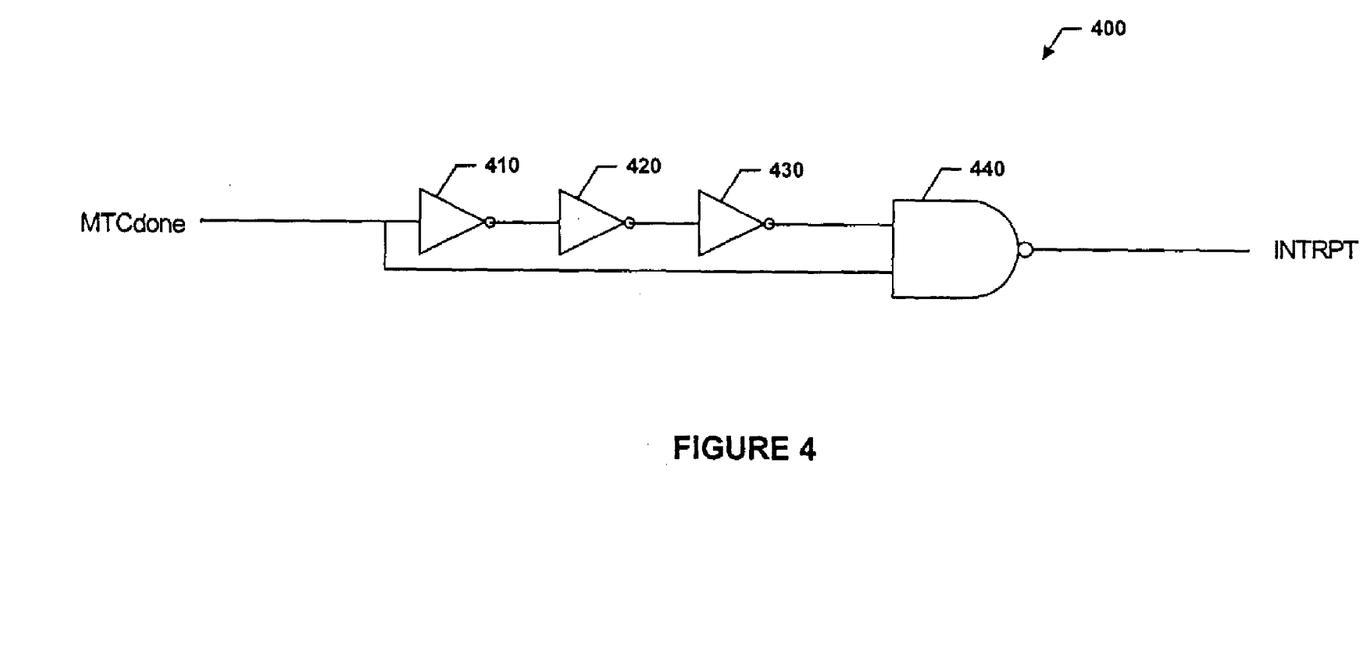
FIG. 4 is a block diagram of an exemplary pulse generator 400 for use in one or more embodiments of the present invention.

FIG. 4 shows a schematic block diagram of an exemplary pulse generator 400 which represents one possible implementation of pulse generator 350 in FIG. 3. Pulse generator 400 includes a pulse-generator input A, a pulse-generator output B, inverters 410, 420, and 430 and a two-input positive NAND gate 440.

Specifically, input A, which is coupled to receive the MTCdone signal (from MTC connector 320 in FIG. 3), drives an input of inverter 310. The output of inverter drives an input of inverter 320, and an output of inverter 320 drives an input of inverter 330. NAND gate 340 has its first input coupled to the output of inverter 330, its second input coupled to input A, and its output coupled to pulse-generator output B. An output of inverter 330 drives a first input of NAND gate 340, which has a second input connected to input A.

The embodiments described in this document are intended only to illustrate and teach one or more exemplary ways of practicing or implementing the present invention, not to restrict its breadth or scope. The actual scope of the invention, which embraces all ways of practicing or implementing the teachings of the invention, is defined only by the following claims and their equivalents.

The invention claimed is:

1. A method comprising:
   detecting a condition of an integrated circuit having a test-access port (TAP) while communicating through a TAP-control selector with the TAP using an automatic tester;
   freezing the integrated circuit in a logic state in response to the detected condition;
   switching control of the test-access port from the automatic tester to a TAP master controller after freezing the integrated circuit in the logic state; and
   communicating through the TAP-control selector with the TAP using the TAP master controller in response to detecting the condition in order to dump state values from the integrated circuit into a memory of the TAP master controller.

2. The method of claim 1, wherein communicating with the TAP using the TAP master controller occurs by having the automatic tester issuing a control signal to the TAP master controller.

3. The method of claim 1, wherein the condition is a failure of the integrated circuit.

4. The method of claim 1:
   wherein the condition is associated with a set of state data in the integrated circuit; and
   wherein communicating with the TAP using the TAP master controller comprises reading the set of state data using the TAP master controller.

5. The method of claim 1, further comprising:
   maintaining the integrated circuit in the detected condition; and
   coupling the TAP master controller to the TAP while maintaining the integrated circuit in the detected condition.

6. The method of claim 5, wherein coupling the TAP master controller to the TAP occurs in response to asserting a control signal on a control input of the TAP-control selector.

7. A method comprising:
   inputting test data from pattern memory through a TAP-control selector and then to a test-access port of an integrated circuit; and
   dumping a desired logic state data and storing a desired logic state data associated with the input test data and output through the TAP-control selector from the test-access port into a memory of a TAP master controller, wherein the memory of the TAP master controller has a lower nominal speed rating than the pattern memory, wherein storing the desired logic state data associated with the input test data occurs after:
      detecting existence of a desired condition of the integrated circuit; decoupling the pattern memory from at least a portion of the test access port; and
      coupling the memory of the TAP master controller to the test-access port of the integrated circuit.

8. The method of claim 7, wherein the pattern memory stores vector test-pattern data and wherein the memory included in the TAP master controller does not store the vector test-pattern data.

9. A system comprising:
   first means for controlling a test-access port of an integrated circuit;
   second means for controlling the test-access port; and
   a multiplexer module, coupled between the test-access port and the first means and between the test-access port and the second means, for selectively coupling the first or second means to the test-access port,
   wherein the first means for controlling the test-access port includes a pattern memory operable to store test pattern data for testing the integrated circuit, the first means operable to assert a control signal applied to the multiplexer module when a failed condition is detected during testing of the integrated circuit, the control signal operable to cause the multiplexer module to selectively couple the second means to the test access port, and wherein the first and second means are external to the integrated circuit.

10. The system of claim 9:
wherein the first and second means include respective first and second sets of signal nodes for outputting or receiving signals from a test-access port; and
wherein the multiplexer module includes first and second multiplexers, with each multiplexer having a first input node coupled to one of the signal nodes in the first set of signal nodes and a second input node coupled to one of the signal nodes in the second set of signal nodes.

11. The system of claim 9, further comprising means for communicating a control signal from the first means to the second means to coordinate control of the test-access port.

12. The system of claim 9, wherein the first and second sets of signal nodes output or receive respective sets of JTAG signals.

13. Apparatus comprising:
a tester having a first node for connection to a test-access port (TAP) of an integrated circuit; and
a multiplexer including a control input, and including first and second selectable nodes and a non-selectable node, with the first selectable node coupled to the first node of the tester, the second selectable node coupled to a TAP master controller, and the non-selectable node coupled to the test-access port, the control input operable to selectively couple either the first selectable node or the second selectable node to the non-selectable node based on a control signal;
wherein the tester is operable to assert a control signal on the control input of the multiplexer causing the multiplexer to selectably couple the second selectable node to the non-selectable node when a targeted test condition occurs on the integrated circuit, and
wherein the tester, the TAP master controller, and the multiplexer are all external to the integrated circuit.

14. The apparatus of claim 13, the TAP master controller including a memory and a boundary scan controller.

15. The apparatus of claim 13, further comprising a pattern generator included in the tester.

16. The apparatus of claim 13, wherein the first TAP master controller comprises a JTAG compliant boundary-scan controller.

17. Apparatus for selecting control of a test-access port of an integrated circuit, comprising:
first means for electrical connection to a node of a tester;
second means for electrical connection to a node of TAP master controller;
third means for electrical connection to a node of a test-access-port of an integrated circuit; and
a first multiplexer coupled to the first, second, and third means for selectively coupling the first or second means to the third means for electrical connection,
wherein the first and second means are external to the integrated circuit.

18. The apparatus of claim 17, further comprising a circuit board supporting the first multiplexer and the first, second, and third means.

19. The apparatus of claim 17, wherein the third means is for connection to one of a test clock node, a test-data-input node, a test-mode-select node, and a test-data-out node of the test-access port.

20. The apparatus of claim 17, further comprising:
fourth means for connection to a node of the tester;
fifth means for connection to a node of the TAP master controller;
sixth means for connection to a node of the test-access-port; and
a second multiplexer coupled to the fourth, fifth, and sixth means for selectively coupling the fourth or fifth conductive means to the sixth conductive means.

21. Apparatus comprising:
a first connector for connection to an automatic tester;
a second connector for connection to a TAP master controller;
a third connector for connection to a test-access-port of an integrated circuit; and
a first multiplexer coupled to respective first, second, and third nodes of the first, second, and third connectors for selectively coupling the first or second nodes to the third nodes, wherein the first multiplexer includes a control input coupled to the automatic tester, the first multiplexer operable to selectively couple the first connect to the third connector or the second connector to the third connector based on whether the automatic tester is asserting a control signal on the control input, and wherein the first TAP master controller and the first multiplexer are external to the integrated circuit.

22. The apparatus of claim 21, further comprising a circuit board supporting the first multiplexer and the first, second, and third connectors.

23. The apparatus of claim 21, wherein each of the first, second, and third connectors includes a test clock node, a test-data-input node, a test-mode-select node, and a test-data-out node.

* * * * *

UNITED STATES PATENT AND TRADEMARK OFFICE
CERTIFICATE OF CORRECTION

PATENT NO. : 7,406,641 B2  Page 1 of 1
APPLICATION NO. : 10/612293
DATED : July 29, 2008
INVENTOR(S) : Day It is certified that error appears in the above-identified patent and that said Letters Patent is hereby corrected as shown below:

In column 8, line 28, in Claim 7, after "from" insert -- a --.

In column 9, line 45, in Claim 17, after "node of" insert -- a --.

In column 10, line 34, in Claim 21, delete "connect" and insert -- connector --, therefor.

Signed and Sealed this

Seventh Day of October, 2008

JON W. DUDAS
*Director of the United States Patent and Trademark Office*